US009450098B2

(12) United States Patent
Lee et al.

(10) Patent No.: US 9,450,098 B2
(45) Date of Patent: Sep. 20, 2016

(54) FINFET HAVING SUPERLATTICE STRESSOR

(71) Applicant: Taiwan Semiconductor Manufacturing Company, Ltd., Hsin-Chu (TW)

(72) Inventors: Yi-Jing Lee, Hsin-Chu (TW); You-Ru Lin, New Taipei (TW); Cheng-Tien Wan, Tainan (TW); Cheng-Hsien Wu, Hsin-Chu (TW); Chih-Hsin Ko, Fongshan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 18 days.

(21) Appl. No.: 14/625,803

(22) Filed: Feb. 19, 2015

(65) Prior Publication Data

US 2015/0162447 A1 Jun. 11, 2015

Related U.S. Application Data

(63) Continuation of application No. 13/422,531, filed on Mar. 16, 2012, now Pat. No. 8,994,002.

(51) Int. Cl.
| | |
|---|---|
| *H01L 29/78* | (2006.01) |
| *H01L 29/10* | (2006.01) |
| *H01L 29/267* | (2006.01) |
| *H01L 29/165* | (2006.01) |
| *H01L 21/02* | (2006.01) |
| *H01L 29/04* | (2006.01) |
| *H01L 29/15* | (2006.01) |
| *H01L 29/161* | (2006.01) |
| *H01L 29/205* | (2006.01) |

(Continued)

(52) U.S. Cl.
CPC ..... *H01L 29/7851* (2013.01); *H01L 21/02532* (2013.01); *H01L 21/02538* (2013.01); *H01L 29/045* (2013.01); *H01L 29/1054* (2013.01); *H01L 29/155* (2013.01); *H01L 29/161* (2013.01); *H01L 29/165* (2013.01); *H01L 29/205* (2013.01); *H01L 29/267* (2013.01); *H01L 29/66795* (2013.01); *H01L 29/785* (2013.01); *H01L 29/7842* (2013.01); *H01L 29/517* (2013.01)

(58) Field of Classification Search
CPC .................... H01L 29/1054; H01L 29/66795; H01L 21/823807; H01L 21/02381; H01L 29/78; H01L 29/78687; H01L 21/02507
See application file for complete search history.

(56) References Cited

U.S. PATENT DOCUMENTS

| | | | |
|---|---|---|---|
| 5,019,874 A | 5/1991 | Inoue et al. | |
| 5,357,119 A | 10/1994 | Wang et al. | |

(Continued)

FOREIGN PATENT DOCUMENTS

| | | |
|---|---|---|
| JP | 11284220 | 10/1999 |
| KR | 100674914 B1 | 1/2007 |

*Primary Examiner* — Bradley K Smith
*Assistant Examiner* — David Goodwin
(74) *Attorney, Agent, or Firm* — Slater Matsil, LLP

(57) ABSTRACT

A fin field effect transistor (FinFET) device is provided. The FinFET includes a superlattice layer and a strained layer. The superlattice layer is supported by a substrate. The strained layer is disposed on the superlattice layer and provides a gate channel. The gate channel is stressed by the superlattice layer. In an embodiment, the superlattice layer is formed by stacking different silicon germanium alloys or stacking other III-V semiconductor materials.

20 Claims, 5 Drawing Sheets

(51) Int. Cl.
   *H01L 29/66* (2006.01)
   *H01L 29/51* (2006.01)

(56) References Cited

U.S. PATENT DOCUMENTS

| | | | |
|---|---|---|---|
| 5,629,231 A | 5/1997 | Kiehl | |
| 6,369,438 B1 | 4/2002 | Sugiyama et al. | |
| 6,515,335 B1 | 2/2003 | Christiansen et al. | |
| 6,534,385 B2 * | 3/2003 | Park | H01L 21/02381 |
| | | | 257/E21.122 |
| 7,091,561 B2 | 8/2006 | Matsushita et al. | |
| 7,154,118 B2 | 12/2006 | Lindert et al. | |
| 7,569,869 B2 * | 8/2009 | Jin | H01L 29/1054 |
| | | | 257/190 |
| 7,629,603 B2 | 12/2009 | Chui et al. | |
| 7,781,771 B2 | 8/2010 | Lindert et al. | |
| 7,888,201 B2 | 2/2011 | Yeo et al. | |
| 7,928,426 B2 | 4/2011 | Chui et al. | |
| 8,058,692 B2 | 11/2011 | Lai et al. | |
| 8,242,001 B2 | 8/2012 | Pillarisetty et al. | |
| 8,283,653 B2 | 10/2012 | Pillarisetty et al. | |
| 8,558,279 B2 | 10/2013 | Cea et al. | |
| 2002/0086494 A1 | 7/2002 | Park et al. | |
| 2002/0171077 A1 | 11/2002 | Chu et al. | |
| 2005/0023554 A1 | 2/2005 | Chu et al. | |
| 2005/0035415 A1 | 2/2005 | Yeo et al. | |
| 2005/0224800 A1 | 10/2005 | Lindert et al. | |
| 2006/0076625 A1 | 4/2006 | Lee et al. | |
| 2006/0273299 A1 * | 12/2006 | Stephenson | B82Y 10/00 |
| | | | 257/15 |
| 2006/0292765 A1 | 12/2006 | Blanchard et al. | |
| 2006/0292889 A1 | 12/2006 | Blanchard et al. | |
| 2011/0147711 A1 | 6/2011 | Pillarisetty et al. | |
| 2012/0032146 A1 | 2/2012 | Pillarisetty et al. | |

* cited by examiner

FINFET HAVING SUPERLATTICE STRESSOR

This application is a continuation of U.S. patent application Ser. No. 13/422,531, filed on Mar. 16, 2012, entitled "FINFET HAVING SUPERLATTICE STRESSOR," which application is hereby incorporated herein by reference in its entirety.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors will be used in sub 32 nm transistor nodes. For example, FinFETs not only improve areal density but also improve gate control of the channel.

In recent years, FinFETs have been constructed with a stressor in order to enhance performance. In some circumstances, the stressor may be formed using silicon germanium (SiGe) grown through a single layer epitaxy process. The stressor may be relaxed using SiGe with a high Ge percentage or by implementing a high temperature anneal process. A gradient Ge percentage of SiGe epitaxy may be used to provide strain.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to preferred embodiments in a specific context, namely a fin field effect transistor (FinFET) metal oxide semiconductor (MOS). The invention may also be applied, however, to other integrated circuits, electronic structures, and the like.

Figure 1:
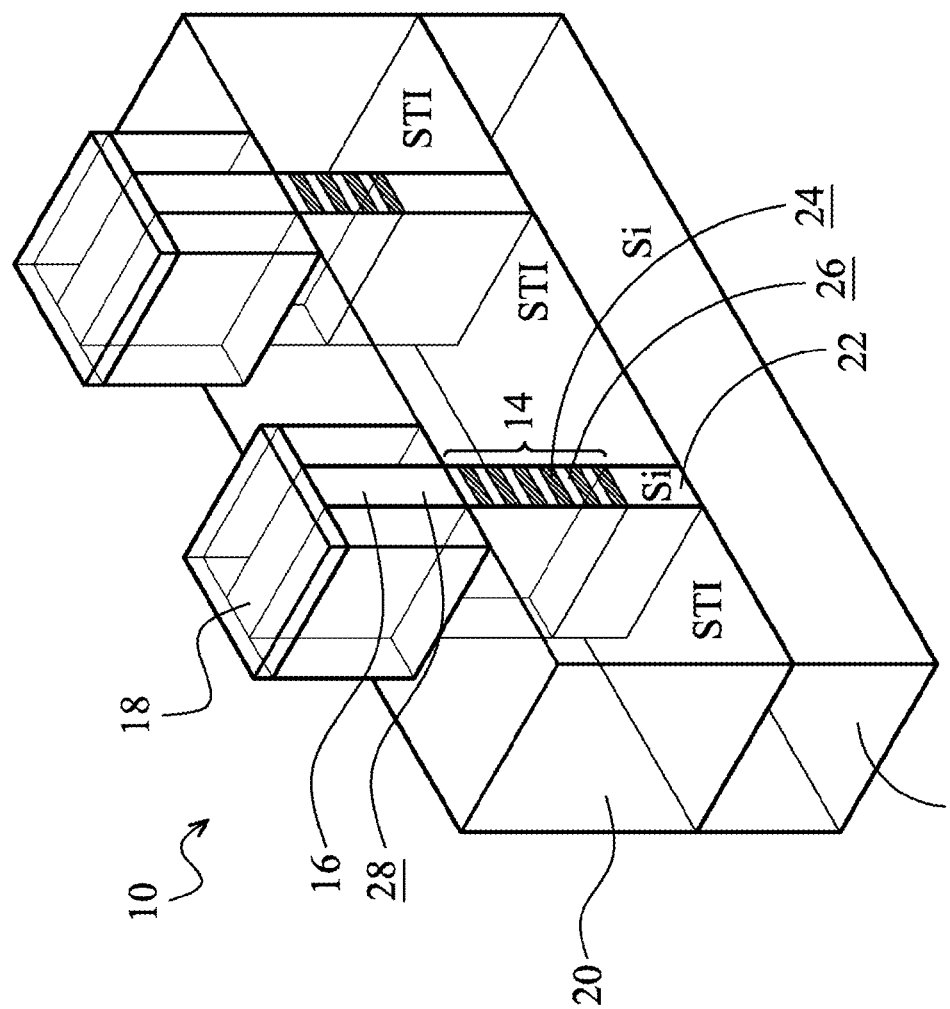
FIG. 1 is a perspective, three dimensional view in partial cross-section illustrating an embodiment fin field effect transistor (FinFET) device with a superlattice layer as a gate channel stressor.

FIG. 1 is a perspective, three-dimensional view in partial cross-section illustrating a FinFET device 10. As will be more fully explained below, the FinFET device 10 includes a gate stressor structure that provides tensile strain to a gate channel, reduces or eliminates emitting stacking faults, provides effective epitaxy relaxation, and functions as a virtual substrate. As shown in FIG. 1, the FinFET device 10 includes a substrate 12, a superlattice layer 14 (a.k.a., superlattice structure), a strained layer 16, and a gate stack 18.

The substrate 12 depicted in FIG. 1 may be formed of silicon or other suitable semiconductor materials. As shown, the substrate 12 is generally disposed beneath a shallow trench isolation (STI) region 20. As such, the substrate 12 is able to support the STI region 20. In an embodiment, a lower or fin portion 22 of the substrate 12 projects upwardly into the STI region 20.

Still referring to FIG. 1, the superlattice layer 14 is generally supported by the substrate 12. In an embodiment, the superlattice layer 14 is disposed on a fin portion 22 of the substrate 12 as shown in FIG. 1. In an embodiment, the superlattice layer 14 may be constructed or built on top of the substrate 12 instead of the fin portion 22. As will be more fully explained below, the superlattice layer 14 functions as a gate stressor for the FinFET device 10.

The superlattice layer 14 is generally formed by stacking different semiconductor materials in an alternating format. As shown in FIG. 1, the superlattice layer 14 includes a first semiconductor material 24 and a second semiconductor material 26. In an embodiment, each of the first and second semiconductor materials 24, 26 are formed from an alloy of silicon germanium (SiGe). In an embodiment, each of the first and second semiconductor materials 24, 26 are formed from a III-V semiconductor material. In an embodiment, the superlattice layer 14 is entirely or substantially embedded in, or encapsulated by, the STI region 20.

Still referring to FIG. 1, the strained layer 16 is generally formed from a semiconductor material. As shown in FIG. 1, the strained layer 16 is formed from a third semiconductor material 28. In an embodiment, the third semiconductor material 28 is formed from an alloy of silicon germanium (SiGe). In an embodiment, the third semiconductor material 28 is formed from a III-V semiconductor material. In an embodiment, the strained layer 16 is entirely disposed above the STI region 20. In other words, the strained layer 16 projects above the STI region 20. In an embodiment, the first and third semiconductor materials 24, 28 are each formed from the same semiconductor material (e.g., the same alloy of silicon germanium).

The gate stack 18 is generally formed over the strained layer 16. As shown in FIG. 1, the gate stack 18 is formed over a portion of the STI region 20, along sidewalls and a top surface of the strained layer 16, and then on an opposing portion of the STI region 20. In an embodiment, the gate stack 18 substantially or entirely encapsulates the strained layer 16. In an embodiment, the gate stack 18 is formed from, for example, an interfacial oxide layer, a high-k value dielectric layer, and a metal layer.

Various materials may be used to form the dielectric portions of the gate stack 18 such as, for example, hafnium oxide (HfO$_2$), zirconium oxide (ZrO$_2$), or other suitable gate dielectric materials that have a desirably high dielectric constant k, i.e., higher than that of silicon dioxide (SiO$_2$). Various suitable thicknesses may be used and are chosen in conjunction with device speed and application. In an embodiment, the gate stack 18 is formed using polysilicon. In an embodiment, the gate stack 18 may be formed from other suitable metals and dielectric materials.

Figure 2:
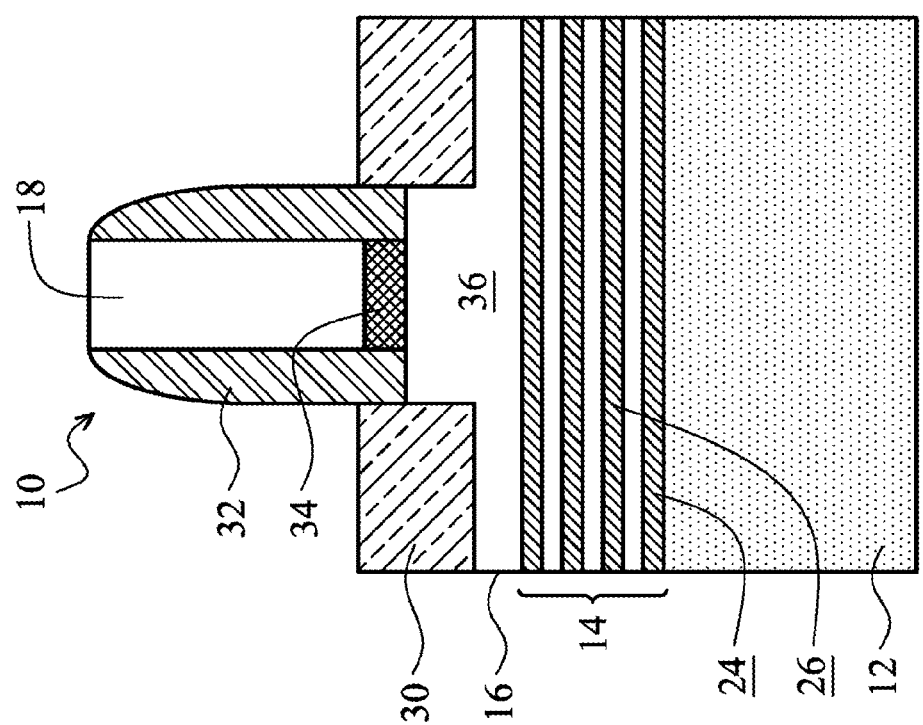
FIG. 2 is a cross section of an embodiment of the FinFET device of FIG. 1 illustrating further device elements.

Referring now to FIG. 2, an embodiment of the FinFET device 10 illustrates further device elements. For example, the FinFET device 10 includes source/drain contacts 30, spacers 32 abutting the gate stack 18, and a hard mask 34. As shown, the source/drain contacts 30 are embedded in the strained layer 16. The source/drain contacts 30 are also disposed on opposing sides of a gate channel 36 (a.k.a., a transistor channel) of the FinFET device 10. In other embodiments, the source/drain contacts 30 may be otherwise oriented or configured.

The gate channel 36 is generally stressed by the superlattice layer 14 of FIG. 1. In other words, the superlattice layer 14 produces stress in the gate channel 36. In an embodiment, the superlattice layer 14 generates a tensile stress in, for example, an n-channel NMOS SiGe gate channel 36. In other embodiments, the superlattice layer 14 may be formed from suitable materials or processes to form stress in other types of gate channels. In an embodiment, the superlattice layer 14 may provide compressive stress to the gate channel 36. In addition to providing stress to the gate channel 36, the superlattice layer 14 is also able to inhibit or prevent emitting stacking faults. Indeed, the superlattice layer 14 generally provides stacking fault free epitaxy and effective epitaxy relaxation. In an embodiment, the superlattice layer 14 may be considered a virtual substrate gate channel stressor.

Still referring to FIG. 2, the hard mask 34 is formed beneath the gate stack 18. The hard mask 34 is generally a high-k dielectric material. In an embodiment, the hard mask 34 is formed from, for example, a high-k dielectric. As shown in FIG. 2, the gate spacers 32 are supported from below by the strained layer 16. In addition, each of the gate spacers 32 is interposed between one of the source/drain contacts 30 and the hard mask 34. In an embodiment, the gate spacers 32 may be otherwise configured or oriented. In an embodiment, the hard mask 34, the gate spacers 32, or both may be formed from or include an oxide, a nitride, an oxynitride, a high-K dielectric like Ta$_2$O, Al$_2$O$_3$, HfO, SiTiO$_3$, HfSiO, HfSiON, ZrSiON, and combinations thereof.

Figure 3:
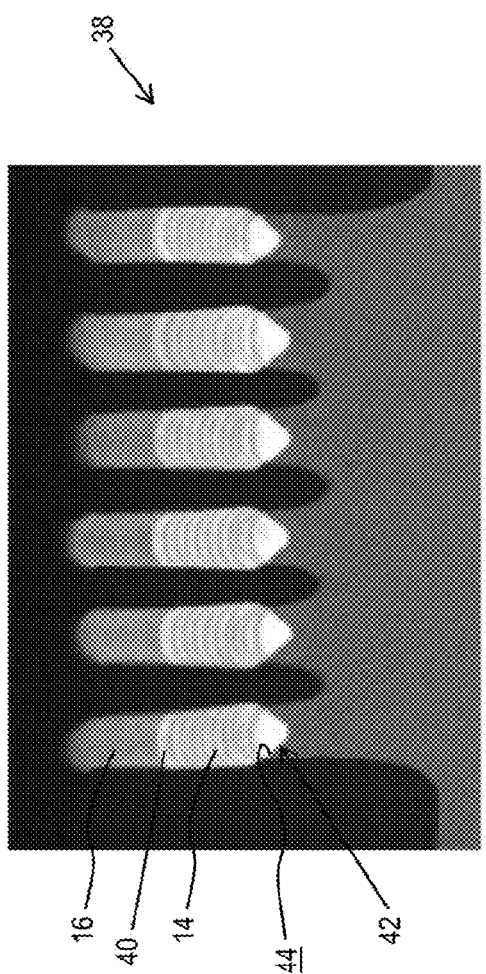
FIG. 3 is a transmission electron microscope (TEM) image depicting several adjacent fins from a FinFET device similar to the FinFET device of FIG. 1.

Referring now to FIG. 3, a transmission electron microscope (TEM) image 38 depicts several adjacent fins 40 of the FinFET device 10. As shown, each of the fins 40 includes one of the strained layers 16 disposed over, or stacked upon, one of the superlattice layers 14. In an embodiment, the superlattice layer 14 is deposited in, or supported by, a v-groove 42 of the substrate 12. In an embodiment, the superlattice layer 14 engages the substrate 12 at a (111) surface 44 of the substrate 12.

Figure 4:
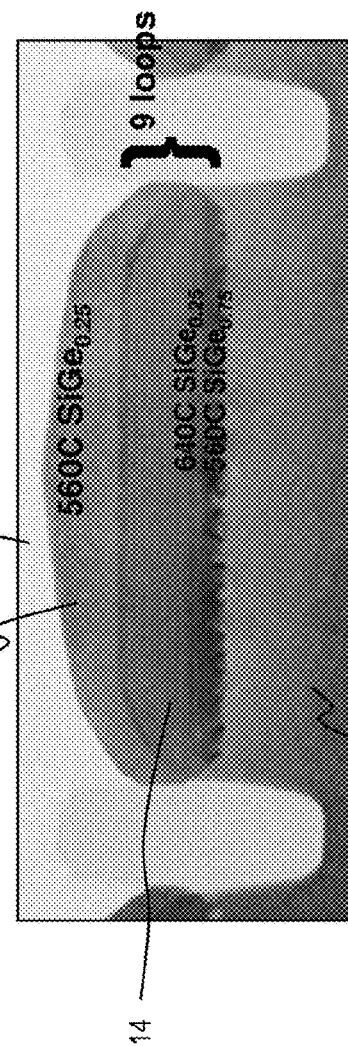
FIG. 4 is a TEM image illustrating a cross section of one of the fins of FIG. 3.

FIG. 4 is a TEM image illustrating a cross section of one of the fins 40 of the FinFET device 10 of FIG. 3. As shown in FIG. 4, the superlattice layer 14, which is disposed on the substrate 12, is formed from alternating silicon germanium alloys. In an embodiment, the superlattice layer 14 is formed from nine (9) bands (a.k.a., loops, layers, etc.) of a 560° C. SiGe$_{0.25}$ and 640° C. SiGe$_{0.75}$ stacked upon each other. In an embodiment, more or fewer bands of materials may be stacked or formed upon one another. As shown in FIG. 4, the strained layer 16, which is disposed on the superlattice layer 14, is formed from a 560° C. SiGe$_{0.25}$. In an embodiment, other semiconductor materials (e.g., III-V semiconductor materials) with other melting temperatures (e.g., between about 400° C. and about 700° C.) may also be used or incorporated into the strained layer 16 and the superlattice layer 14.

Figure 5:
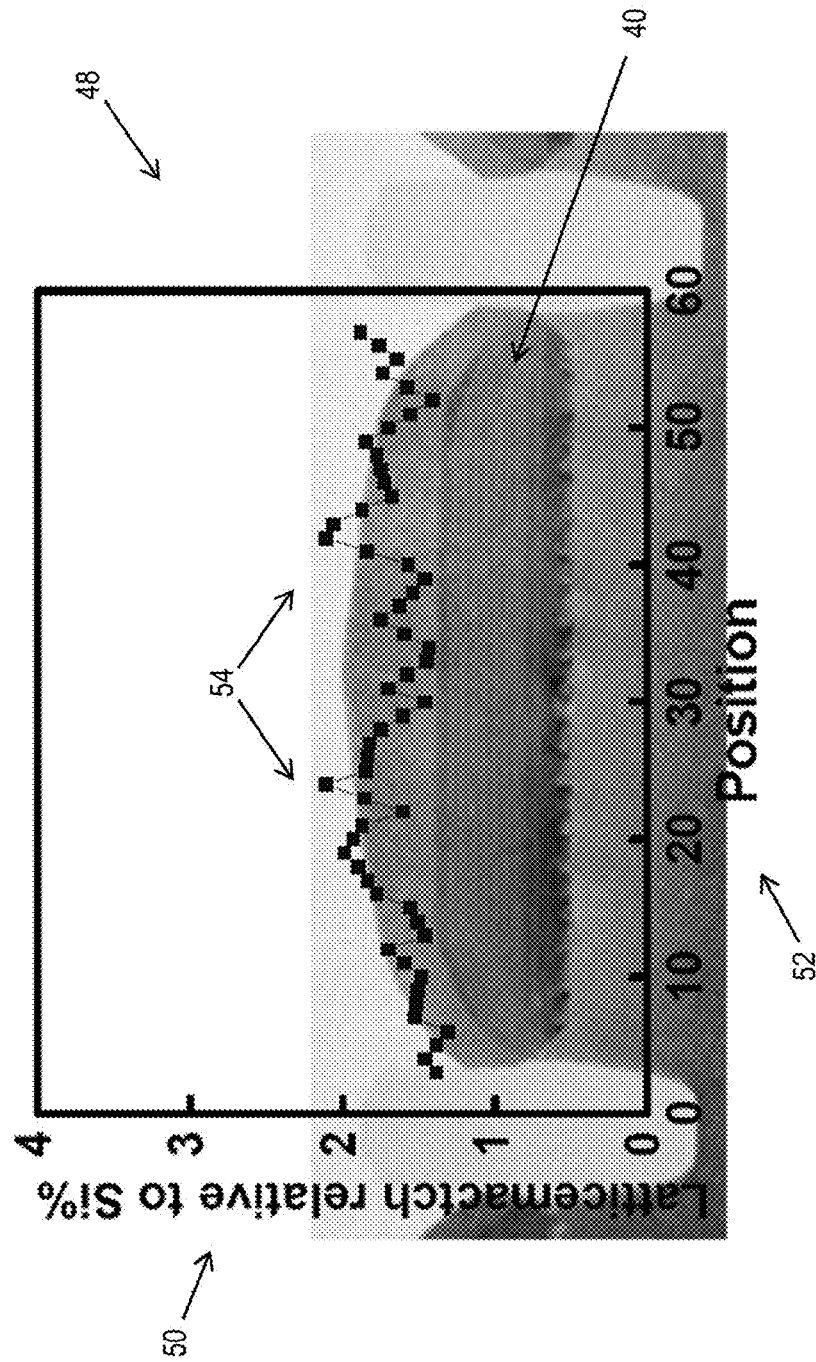
FIG. 5 is a graphical representation of the strain analysis of the fin of FIG. 3.

Referring now to FIG. 5, a graph 48 representing a strain analysis of the fin 40 of FIG. 3. As shown in FIG. 5, the lattice match relative to the percentage of silicon (Si%) 50 is provided on the vertical axis (i.e., the y-axis) of the graph 48. In addition, a position 52 along the fin 40 is provided on the horizontal axis (the x-axis) of the graph 48. The position 52 represents a set of points along a horizontal distance, not a specific unit of measurement (e.g., nanometers). As illustrated by the various data points 54 in the graph 48, the lattice match relative to Si% 50 is between about one (1) and about two (2) over the entire fin 40 between position zero (0) and position sixty (60).

Figure 6:
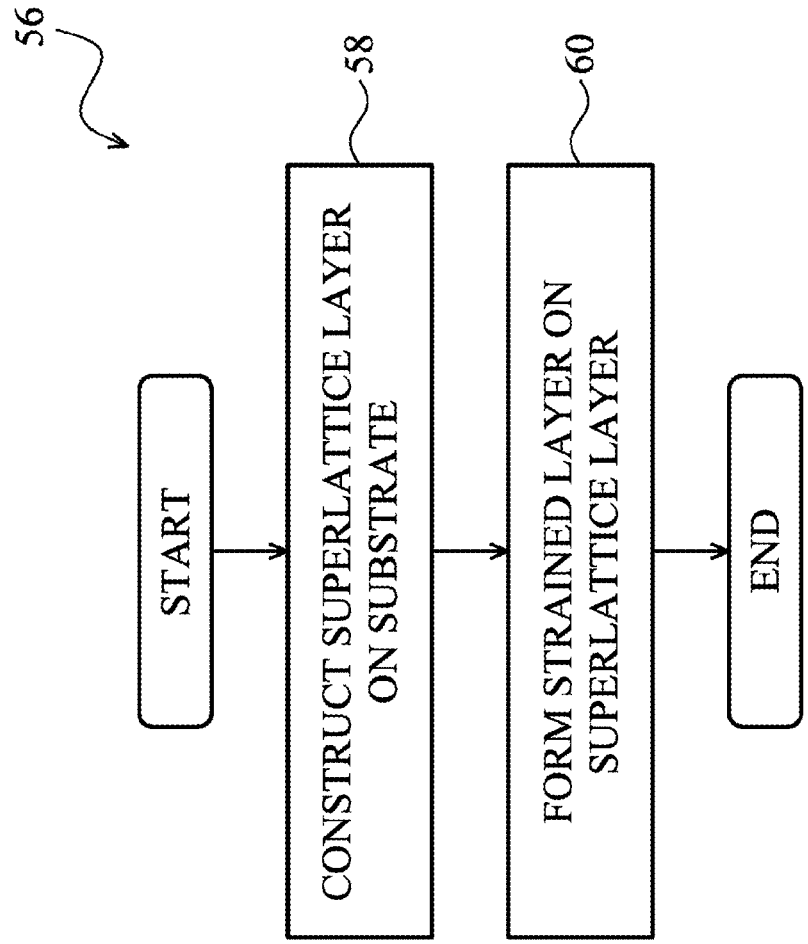
FIG. 6 is an embodiment of a method of forming a stressor for the FinFET device of FIG. 1.

Referring now to FIG. 6, a method 56 of forming a stressor for the FinFET device 10 of FIG. 1 is illustrated. In block 58, the superlattice layer 14 is constructed on the substrate 12. In block 60, the strained layer 16 is formed on the superlattice layer 14. The strained layer 16 provides the gate channel 36, which is stressed by the superlattice layer 14. In other words, the superlattice layer 14 functions as the stressor.

A fin field effect transistor (FinFET) device. The device comprises a superlattice layer supported by a substrate, a strained layer disposed on the superlattice layer and providing a gate channel, the gate channel stressed by the superlattice layer.

A field effect transistor (FinFET) device. The device comprises a superlattice layer supported by a substrate, a shallow trench isolation (STI) region encapsulating the superlattice layer, a strained layer disposed on the superlattice layer and providing a gate channel, the gate channel stressed by the superlattice layer, and a gate stack formed over the strained layer.

A method of forming a stressor for a fin field effect transistor (FinFET) device. The method comprises constructing a superlattice layer on a substrate and forming a strained layer on the superlattice layer, the strained layer providing a gate channel, the gate channel stressed by the superlattice layer.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A structure comprising:
    a substrate having a first isolation region and a second isolation region;
    a superlattice structure disposed over the substrate and between the first isolation region and the second isolation region, the superlattice structure comprising alternating first semiconductor layers and second semiconductor layers, the first semiconductor layers comprising a first material, the second semiconductor layers comprising a second material different from the first material;

a strained layer disposed over the superlattice structure, the strained layer forming at least a portion of a fin protruding from between the first isolation region and the second isolation region, the superlattice structure inducing stress in the strained layer by a lattice mismatch between the strained layer and at least one of the alternating first semiconductor layers and second semiconductor layers of the superlattice structure; and a gate structure over the strained layer, the gate structure defining a channel region in the strained layer.

2. The structure of claim 1 further comprising a first source/drain region in the fin and a second source/drain region in the fin, the first source/drain region and the second source/drain region being on opposing sides of the channel region.

3. The structure of claim 1, wherein the superlattice structure is disposed in a v-groove of the substrate.

4. The structure of claim 1, wherein the superlattice structure contacts a (111) surface of the substrate.

5. The structure of claim 1, wherein the first semiconductor layers comprise a first silicon germanium alloy with a first atomic composition and the second semiconductor layers comprise a second silicon germanium alloy with a second atomic composition, the first atomic composition being different from the second atomic composition.

6. The structure of claim 1, wherein the first semiconductor layers comprise a first III-V material with a first atomic composition and the second semiconductor layers comprise a second III-V material with a second atomic composition, the first atomic composition being different from the second atomic composition.

7. The structure of claim 1, wherein the strained layer is tensilely strained.

8. The structure of claim 1, wherein the strained layer is compressively strained.

9. The structure of claim 1, wherein an upper surface of the superlattice structure distal the substrate is closer to the substrate than an upper surface of the first isolation region distal the substrate.

10. The structure of claim 1, wherein the superlattice structure reduces or prevents emitting stacking faults.

11. A structure comprising:
a fin comprising a strained layer, the fin protruding from between a first isolation region on a substrate and a second isolation region on the substrate, the strained layer being disposed on a superlattice structure comprising alternating first layers and second layers, at least one of the first layers and second layers inducing a stress in the strained layer, each of the first layers being a first III-V material with a first atomic composition, and each of the second layers being a second III-V material with a second atomic composition different from the first atomic composition;

a gate structure on the fin, the gate structure defining a channel region in the strained layer;
a first source/drain region in the fin; and
a second source/drain region in the fin, the channel region being disposed between the first source/drain region and the second source/drain region.

12. The structure of claim 11, wherein the strained layer protrudes above and from between the first isolation region and the second isolation region.

13. The structure of claim 11, wherein each of the first layers is a first silicon germanium alloy with the first atomic composition, and each of the second layers is a second silicon germanium alloy with the second atomic composition.

14. The structure of claim 11, wherein the strained layer is tensilely strained.

15. The structure of claim 11, wherein the strained layer is compressively strained.

16. A structure comprising:
a fin bottom portion on a substrate, the fin bottom portion being between a first isolation region and a second isolation region;
a superlattice structure on the fin bottom portion, the superlattice structure comprising alternating first layers and second layers, each of the first layers being a first III-V material with a first atomic composition, and each of the second layers being a second III-V material with a second atomic composition different from the first atomic composition;
a strained layer on the superlattice structure, at least one of the first layers and second layers inducing a stress in the strained layer, at least a portion of the strained layer forming at least a portion of a fin protruding above the first isolation region and the second isolation region; and
a gate structure on the fin, the gate structure defining a channel region in the strained layer.

17. The structure of claim 16, wherein each of the first layers is a first silicon germanium alloy with the first atomic composition, and each of the second layers is a second silicon germanium alloy with the second atomic composition.

18. The structure of claim 16, wherein the fin bottom portion has a v-groove, the superlattice structure contacting the v-groove of the fin bottom portion.

19. The structure of claim 16 further comprising a first source/drain region in the strained layer and a second source/drain region in the strained layer, the channel region being disposed between the first source/drain region and the second source/drain region.

20. The structure of claim 16, wherein the strained layer is tensilely strained.

* * * * *